(12) United States Patent
Kiwitt

(10) Patent No.: US 9,294,070 B2
(45) Date of Patent: Mar. 22, 2016

(54) DUPLEXER WITH BALUN

(75) Inventor: Jürgen Kiwitt, Munich (DE)

(73) Assignee: EPCOS AG, Munich (DE)

( * ) Notice: Subject to any disclaimer, the term of this patent is extended or adjusted under 35 U.S.C. 154(b) by 365 days.

(21) Appl. No.: 13/817,809

(22) PCT Filed: Jul. 29, 2011

(86) PCT No.: PCT/EP2011/063111
§ 371 (c)(1),
(2), (4) Date: May 1, 2013

(87) PCT Pub. No.: WO2012/022599
PCT Pub. Date: Feb. 23, 2012

(65) Prior Publication Data
US 2013/0207743 A1 Aug. 15, 2013

(30) Foreign Application Priority Data
Aug. 20, 2010 (DE) .......................... 10 2010 034 914

(51) Int. Cl.
H03H 9/70 (2006.01)
H03H 9/58 (2006.01)
(Continued)

(52) U.S. Cl.
CPC . *H03H 9/70* (2013.01); *H03H 7/42* (2013.01); *H03H 9/0557* (2013.01);
(Continued)

(58) Field of Classification Search
CPC ..... H03H 9/70; H03H 9/0557; H03H 9/0571; H03H 9/0576; H03H 9/706; H03H 9/725; H03H 7/42
USPC .......................................................... 333/133
See application file for complete search history.

(56) References Cited

U.S. PATENT DOCUMENTS

| 5,949,299 A | 9/1999 | Harada |
|---|---|---|
| 2002/0171508 A1 | 11/2002 | Harada et al. |

(Continued)

FOREIGN PATENT DOCUMENTS

| DE | 10225202 A1 | 12/2003 |
|---|---|---|
| DE | 10228328 A1 | 1/2004 |

(Continued)

OTHER PUBLICATIONS

Sakhnenko et al., Low Profile LTCC Balanced Filter Based on a Lumped Elements Balun for WiMAX Applications, Jun. 2008, International Microwave Symposium Digest, pp. 1111-1114.*

(Continued)

*Primary Examiner* — Stephen E Jones
*Assistant Examiner* — Scott S Outten
(74) *Attorney, Agent, or Firm* — McDermott Will & Emery LLP

(57) ABSTRACT

A duplexer is proposed with a substrate which has at least one patterned metallization plane and on which, at least to some extent, a transmission path (TX) and a reception path (RX) are arranged, both of which are connected to an antenna connection (ANT). The duplexer comprises a transmission filter (TXF) which is arranged in the transmission path (TX) and which has a first acoustic wave filter (BAW1) with one or more resonators. Furthermore, the duplexer (DPL) comprises a reception filter (RXF) which is arranged in the reception path (RX) on the antenna side and which has a second acoustic wave filter (BAW2) with one or more resonators and also a single-ended output. In addition, the duplexer comprises, in the reception path (RX), a balun (BL) which is connected downstream of the reception filter (RXF) and the output of which delivers a balanced signal and which is in the form of an LC circuit, wherein at least one inductance and/or at least one capacitance of the balun (BL) are implemented in the patterned metallization plane of the substrate.

8 Claims, 4 Drawing Sheets

(51) Int. Cl.
  *H03H 7/42* (2006.01)
  *H03H 9/05* (2006.01)
  *H03H 9/72* (2006.01)
  *H03H 1/00* (2006.01)

(52) U.S. Cl.
  CPC .......... *H03H 9/0571* (2013.01); *H03H 9/0576* (2013.01); *H03H 9/706* (2013.01); *H03H 9/725* (2013.01); *H03H 2001/0085* (2013.01)

(56) References Cited

U.S. PATENT DOCUMENTS

| | | |
|---|---|---|
| 2003/0090338 A1 | 5/2003 | Muramatsu |
| 2003/0227357 A1 | 12/2003 | Metzger et al. |
| 2005/0230812 A1 | 10/2005 | Przadka |
| 2006/0066419 A1* | 3/2006 | Iwaki ................ H03H 7/46 333/133 |
| 2007/0268091 A1 | 11/2007 | Iwamoto et al. |
| 2007/0268092 A1 | 11/2007 | Inoue et al. |
| 2008/0246557 A1 | 10/2008 | Kiwitt et al. |
| 2011/0193650 A1* | 8/2011 | Takenoshita ........ H03H 9/0576 333/4 |

FOREIGN PATENT DOCUMENTS

| | | |
|---|---|---|
| EP | 1860773 A2 | 11/2007 |
| JP | 2000114917 A | 4/2000 |
| JP | 2002-344347 A | 11/2002 |
| JP | 2005109880 A | 4/2005 |
| JP | 2006-093996 A | 4/2006 |
| JP | 2007-312145 A | 11/2007 |
| JP | 2007-312324 A | 11/2007 |
| JP | 2009-089165 A | 4/2009 |
| WO | 2004/066494 A1 | 8/2004 |
| WO | WO-2004/105174 A1 | 12/2004 |
| WO | 2005/091501 A1 | 9/2005 |

OTHER PUBLICATIONS

Miron, Douglas B.: "The LC immittance inverter", RF Design, Primedia Business Magazines & Media, vol. 23, No. 1, pp. 20, 22, 24 and 26, Jan. 1, 2000.

Sim, Sung-Hun et al.: "A compact lumped-element lowpass filter using low temperature cofired ceramic technology", Journal of the European Ceramic Society, vol. 23, No. 14, pp. 2717-2720, Jan. 1, 2003.

* cited by examiner

DUPLEXER WITH BALUN

The invention relates to a duplexer comprising a balun in a reception path.

A duplexer is a frequency-dividing network for separating for example a reception signal and a transmission signal of a predefined frequency band of a data transmission system in which the data transmission can be effected for example via a common antenna in both directions. In applications in the range of radio frequencies, use is predominantly made of filter structures having an unbalanced filter input and output, the characteristic impedance of which in each case refers to ground. Coupling-in of interference signals, particularly into a reception signal path, can appreciably reduce a performance of such a data transmission system.

The object on which the invention is based is to specify a duplexer having improved electrical properties.

The object is achieved by means of the features of the independent claims. Advantageous configurations of the invention are characterized in the dependent claims.

The invention is distinguished by a duplexer, comprising a substrate, which has at least one patterned metallization plane, and, arranged at least partly on the substrate, a transmission path and a reception path, which are both connected to an antenna connection. The duplexer comprises a transmission filter, which is arranged in the transmission path and which has a first acoustic wave filter having one or more resonators. Furthermore, the duplexer comprises a reception filter, which is arranged in the reception path on the antenna side and which has a second acoustic wave filter having one or more resonators and has a single-ended output. Furthermore, the duplexer comprises in the reception path a balun connected downstream of the reception filter, said balun supplying a balanced signal on the output side and being embodied as an LC circuit, wherein at least one inductance and/or at least one capacitance of the balun are/is realized in the patterned metallization plane of the substrate.

The balun makes it possible to convert an unbalanced (also referred to as "single-ended") signal at the output of the reception filter into a balanced signal and thus to form the duplexer with a balanced output at the receiving end. Providing a balanced signal at the output of the reception path has the advantage that a balanced signal is available at the output of the reception path, which signal, in comparison with an unbalanced signal, can have a lower susceptibility to interference, for example relative to crosstalk and/or to signals being coupled in externally. A balanced signal usually also has a higher signal-to-noise ratio. The balun can furthermore contribute to making it possible to ensure sufficient isolation between the reception filter and the transmission filter. Furthermore, a circuit arrangement of this type makes it possible that predefined electrical transmission requirements made of the duplexer comprising acoustic wave filters which are embodied with simple, uncoupled, resonator structures can be fulfilled sufficiently. This makes possible a cost-effective realization. An embodiment of the respective acoustic wave filter as a reactance filter (ladder-type arrangement) is likewise possible.

In accordance with one advantageous configuration, the substrate is constructed from a multilayer ceramic.

In accordance with a further advantageous configuration, the first acoustic wave filter and/or the second acoustic wave filter have/has at least one resonator that operates with bulk acoustic waves. It is advantageous to embody the first and second acoustic wave filters as bulk acoustic wave filters (BAW filters), since bulk acoustic wave filters (BAW filters) can have a higher quality factor than surface acoustic wave filters (SAW filters). It is also possible to embody the first and/or the second acoustic wave filter as surface acoustic wave filter(s) (SAW filter(s)). The first acoustic wave filter and the second acoustic wave filter can therefore also be embodied differently.

In accordance with a further advantageous configuration, the balun has a first balanced connection, a second balanced connection and an unbalanced connection. Furthermore, the balun has a first inductance and a second capacitance, wherein the first inductance is electrically coupled to the first balanced connection and a reference potential and the second capacitance is electrically coupled to the second balanced connection and the reference potential. Furthermore, the balun comprises a second inductance and a first capacitance, wherein the second inductance is electrically coupled to the second balanced connection and the unbalanced connection and the first capacitance is electrically coupled to the first balanced connection and the unbalanced connection. The balun embodied in this way advantageously has a very low insertion loss. In the case of such an embodiment of the balun, the space requirement, for example in the case of a realization on a ceramic substrate, can be kept small and a sensitivity toward component variations, for example on account of manufacturing tolerances or ambient influences, can be kept below a predefined limit value.

In accordance with a further advantageous configuration, the balun has the first balanced connection and the second balanced connection and also the unbalanced connection. Furthermore, the balun comprises a T-element having a third capacitance and a fourth capacitance in the series branch and a third inductance in the parallel branch, wherein the third capacitance is electrically coupled to the first balanced connection and the fourth capacitance is electrically coupled to the unbalanced connection. The balun furthermore has a fifth capacitance, which is electrically coupled to the second balanced connection and the reference potential, and a fourth inductance, which is electrically coupled to the second balanced connection and the unbalanced connection. The balun embodied in this way can advantageously have a comparatively low sensitivity toward component variations, for example on account of manufacturing tolerances and/or ambient influences.

In accordance with a further advantageous configuration, the first acoustic wave filter and the second acoustic wave filter are arranged on separate chips. In this way, it is possible to optimize each acoustic wave filter separately from the other.

In accordance with a further advantageous configuration, the substrate is part of a housing for the duplexer or of a module comprising the duplexer.

In accordance with a further advantageous configuration, the substrate has an upper metallization plane, in which an at least large-area first reference potential area is arranged, and a lower metallization plane, in which an at least large-area second reference potential area is arranged, wherein the first reference potential area and second reference potential area are in each case electrically coupled to the reference potential. Furthermore, the at least one patterned metallization plane, in which capacitances and/or inductances of the balun and/or of further circuit components are realized, is arranged between the upper metallization plane and lower metallization plane. The substrate can, for example, have the first reference potential area on a first surface side and the second reference potential area on a second surface side. It is advantageous, for example, if the reference potential areas are embodied such that they are metalized approximately over the whole area. The upper and/or lower metallization plane can in each case partly have structures, thus for example in the form of contact area cutouts, thereby making it possible to make contact with, for example, the first and second balanced connections and/or the unbalanced connection.

In accordance with a further advantageous configuration, the substrate has an integrated first branch junction, which represents the first balanced connection of the balun, and an integrated second branch junction, which represents the second balanced connection, wherein the first branch junction and second branch junction are arranged between the upper metallization plane and lower metallization plane.

In accordance with a further advantageous configuration, the substrate has a total substrate thickness and the first branch junction and the second branch junction are arranged at the same level or are arranged in such a way that a level difference in a vertical direction perpendicular to the lower metallization plane and/or upper metallization plane between the first branch junction and the second branch junction is less than 0.2 times the total substrate thickness.

In accordance with a further advantageous configuration, a first parallel branch comprises the first capacitance and the first inductance and a second parallel branch comprises the second capacitance and the second inductance, or the first parallel branch comprises the fourth capacitance and the third inductance and the second parallel branch comprises the fifth capacitance and the fourth inductance. Furthermore, the first parallel branch is electrically coupled to the first reference potential area but not to the second reference potential area, and the second parallel branch is electrically coupled at least to the first reference potential area.

In accordance with a further advantageous configuration, a metal area which is electrically coupled to the reference potential is arranged between the first capacitance or the fourth capacitance and a third branch junction, which represents the unbalanced connection. The metal area which is electrically coupled to the reference potential can advantageously be utilized as a shielding area, thereby reducing any coupling-in of interference signals particularly onto the first capacitance or the fourth capacitance. Additionally or alternatively, it is possible to form a distance between the third branch junction and the first or fourth capacitance such that it is as large as possible, for example greater than approximately 300 μm.

In accordance with a further advantageous configuration, the substrate has at least one soldering pad, wherein the soldering pad is at least partly utilized as the third capacitance. For mounting the substrate, for example on a printed circuit board assembly, the substrate can have one or more soldering pads. The respective soldering pad can have a capacitance which can at least partly be utilized in terms of circuitry. It is advantageous to arrange the third capacitance in such a way that it is at a large distance from the third and fourth inductances. This can be realized, for example, by arranging the third capacitance in a patterned metallization plane which is at a large distance from a respective patterned metallization plane in which the third and/or the fourth inductance are/is arranged.

Furthermore, it is advantageous if the third and fourth inductances or the first and second inductances are at a sufficiently large distance from large metal areas. By way of example, the second inductance or the fourth inductance is electrically coupled to the reference potential, preferably to the ground potential, by means of a conductor track. The conductor track has a conductor track capacitance. The conductor track capacitance and the second or fourth inductance form a resonant circuit. It is therefore advantageous to embody and arrange the second inductance or the fourth inductance and further layout components such that a resonant frequency of said resonant circuit is at least 1.5 times greater than a center frequency of the balun.

The invention is explained in greater detail below on the basis of exemplary embodiments and the associated schematic drawings, in which.

Elements of identical construction or function are provided with the same reference signs throughout the figures.

Figure 1:
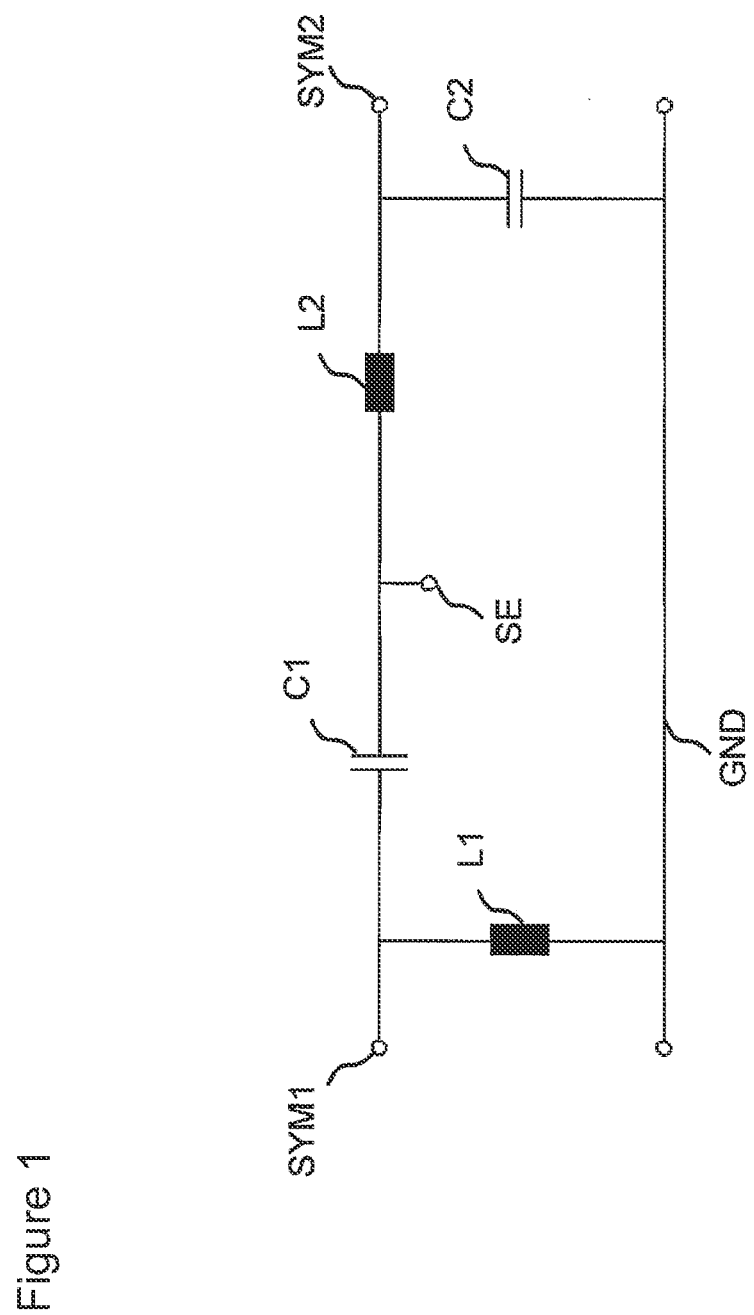
FIG. 1 shows a first exemplary embodiment of a balun BL.

FIG. 1 shows a first exemplary embodiment of the balun BL. The balun BL has a first balanced connection SYM1 and a second balanced connection SYM2 and also an unbalanced connection SE.

The balun BL has for example a first inductance L1 and a second capacitance C2, wherein the first inductance L1 is electrically coupled to the first balanced connection SYM1 and a reference potential GND, and the second capacitance C2 is electrically coupled to the second balanced connection SYM2 and a reference potential GND. Furthermore, the balun BL has a second inductance L2 and a first capacitance C1, wherein the second inductance L2 is electrically coupled to the second balanced connection SYM2 and the unbalanced connection SE and the first capacitance C1 is electrically coupled to the first balanced connection SYM1 and the unbalanced connection SE. The balun BL can be realized for example as an integrated circuit on a multilayer ceramic, for example low temperature cofired ceramics (LTCC).

Figure 2:
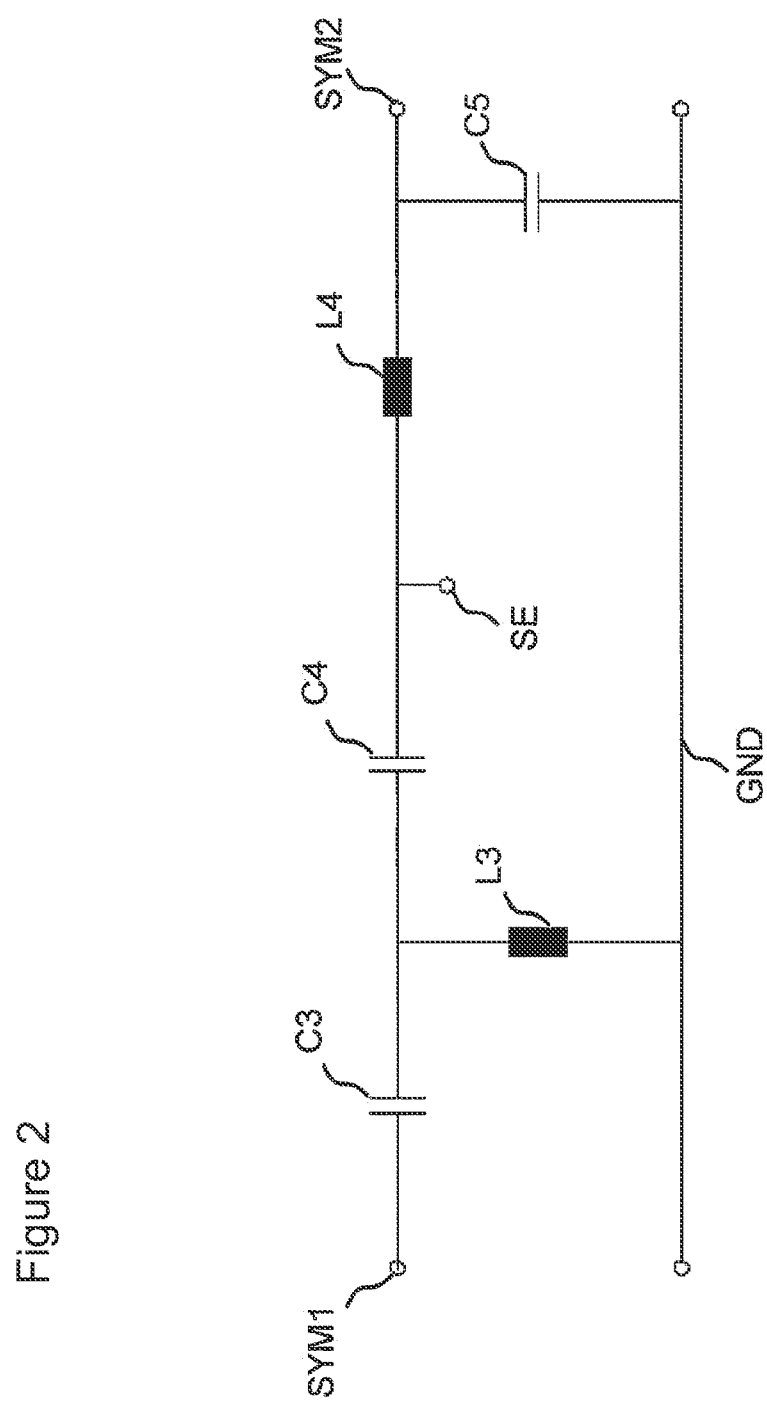
FIG. 2 shows a second exemplary embodiment of the balun BL.

FIG. 2 shows a second exemplary embodiment of the balun BL. Analogously to the exemplary embodiment of the balun BL as shown in FIG. 1, the balun BL has a first balanced connection SYM1 and a second balanced connection SYM2 and also an unbalanced connection SE. The balun BL shown in FIG. 2 has for example a T-element having a third capacitance C3 and fourth capacitance C4 in the series branch and a third inductance L3 in the parallel branch, wherein the third capacitance C3 is electrically coupled to the first balanced connection SYM1, and the fourth capacitance C4 is electrically coupled to the unbalanced connection SE. Furthermore, the balun BL has a fifth capacitance C5, which is electrically coupled to the second balanced connection SYM2 and the reference potential GND. A fourth inductance L4 of the balun BL is electrically coupled to the second balanced connection SYM2 and the unbalanced connection SE. The balun BL shown in FIG. 2 can also advantageously be realized as an integrated circuit on a multilayer ceramic, for example low temperature cofired ceramics (LTCC).

Figure 3:
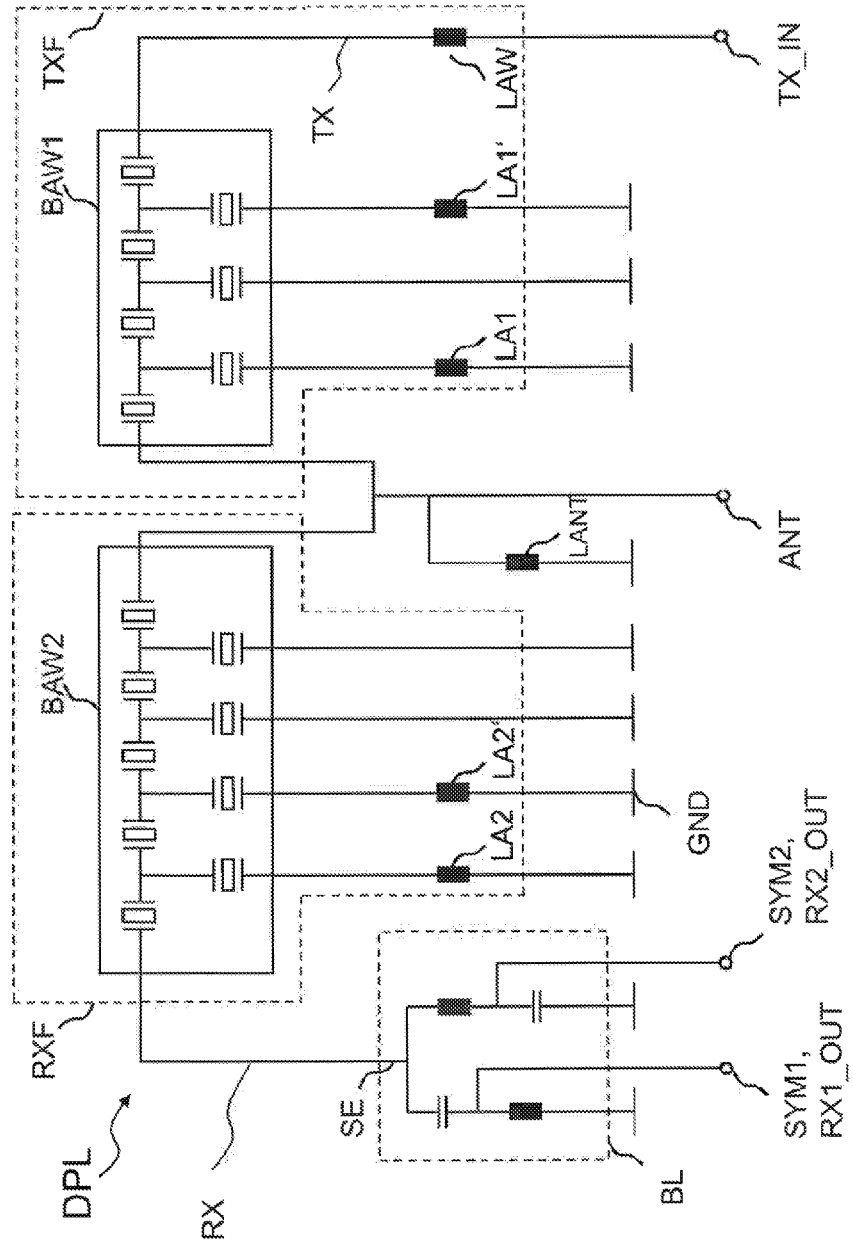
FIG. 3 shows an exemplary embodiment of the duplexer DPL.

FIG. 3 shows an exemplary embodiment of the duplexer DPL. A transmission path TX and a reception path RX are connected to an antenna connection ANT. In the transmission path TX, a transmission filter TXF is arranged between the antenna connection ANT and a transmission input TX_IN. In the reception path RX, a reception filter RXF is arranged on the antenna side. A balun BL is arranged between the reception filter RXF and reception outputs RX1_OUT, RX2_OUT, said balun BL having a balanced signal output on the output side. The balun BL can be embodied for example as an LC circuit having inductances and capacitances as circuit components.

The transmission filter TXF has a first acoustic wave filter BAW1, for example. The first acoustic wave filter BAW1 can be embodied for example as a surface acoustic wave filter (SAW) or preferably as a bulk acoustic wave filter (BAW). The first acoustic wave filter BAW1 shown in FIG. 3 has a plurality of series and parallel resonators, for example.

Furthermore, the transmission filter TXF has a first matching network. The first matching network of the transmission filter TXF can make it possible to increase a bandwidth of the first acoustic wave filter BAW1 and can contribute to improving an input-side matching of the transmission filter TXF. The first matching network has for example a first matching inductance LA1 and a further first matching inductance LA1'. The two first matching inductances LA1, LA1' are respectively electrically coupled to a parallel resonator of the first acoustic wave filter BAW1 and the reference potential GND. Furthermore, the matching network has a further matching inductance LAW, which is connected in series with the transmission path TX at the transmitting end.

The reception filter RXF has a second acoustic wave filter BAW2, for example. The second acoustic wave filter BAW2 can be embodied for example as a surface acoustic wave filter (SAW) or preferably as a bulk acoustic wave filter (BAW). The first acoustic wave filter BAW1 and second acoustic wave filter (BAW2) can have identical or different filter technologies. The two acoustic waves filters BAW1, BAW2 can be arranged on different chips or on one chip. Preferably, the two acoustic wave filters BAW1, BAW2 have the same filter technology in the case of an arrangement on one chip for both acoustic wave filters BAW1, BAW2. The second acoustic wave filter BAW2 shown in FIG. 3 has a plurality of series and parallel resonators, for example.

Furthermore, the reception filter RXF has a second matching network. The second matching network has for example a second matching inductance LA2 and a further second matching inductance LA2'. The two second matching inductances LA2, LA2' are respectively electrically coupled to a parallel resonator of the second acoustic wave filter BAW2 and the reference potential GND.

Supplementarily, the duplexer DPL can have, on the antenna side, an antenna matching network in the transmission path TX and/or in the reception path RX. The antenna matching network can be arranged for example between the antenna connection ANT and the reception filter RXF and/or between the antenna connection ANT and the transmission filter TXF. The antenna matching network shown in FIG. 3 has an inductance LANT, which is electrically coupled to the antenna connection ANT and the reference potential GND. The antenna matching network makes it possible to match a characteristic impedance of an antenna input and/or output within a respectively predefined frequency range. The antenna matching network can additionally or alternatively also be embodied in such a way that it contributes to improving a frequency-dividing network function of the duplexer.

The balun BL of the duplexer DPL shown in FIG. 3 can be embodied for example in accordance with the first exemplary embodiment of the balun BL or in accordance with the second exemplary embodiment of the balun BL. Alternatively, it is possible for some other suitably designed circuit having a balun function to be utilized as balun BL for the duplexer DPL.

The duplexer DPL embodied in this way can advantageously be constructed or mounted on a substrate having at least one patterned metallization plane, for example on a multilayer ceramic. For this purpose, by way of example, at least parts of the transmission path TX and of the reception path RX are arranged on the substrate. In the exemplary embodiment shown in FIG. 3, by way of example, the antenna matching network, the first matching network of the transmission filter TXF, the second matching network of the reception filter RXF and the balun BL are realized in the at least one patterned metallization plane of the substrate. Firstly, this enables the space requirement for the duplexer DPL to be kept small. Secondly, this makes it possible for the passive circuit components to be suitably dimensioned and/or optimized depending on predefined requirements made of circuit properties of the duplexer DPL. Furthermore, coupling of interference signals into the balun BL and/or into further components of the duplexer DPL can be kept small by means of suitable circuit layer measures. The interference signals can be brought about for example in particular by the inductances of the first matching network and/or of the second matching network and/or of the antenna matching network.

In the exemplary embodiment shown in FIG. 3, the first acoustic wave filter BAW1 and the second acoustic wave filter BAW2 are realized on different chips arranged on the substrate. The chips and further circuit components can be interconnected in the at least one patterned metallization plane and/or a further patterned metallization plane.

Figure 4:
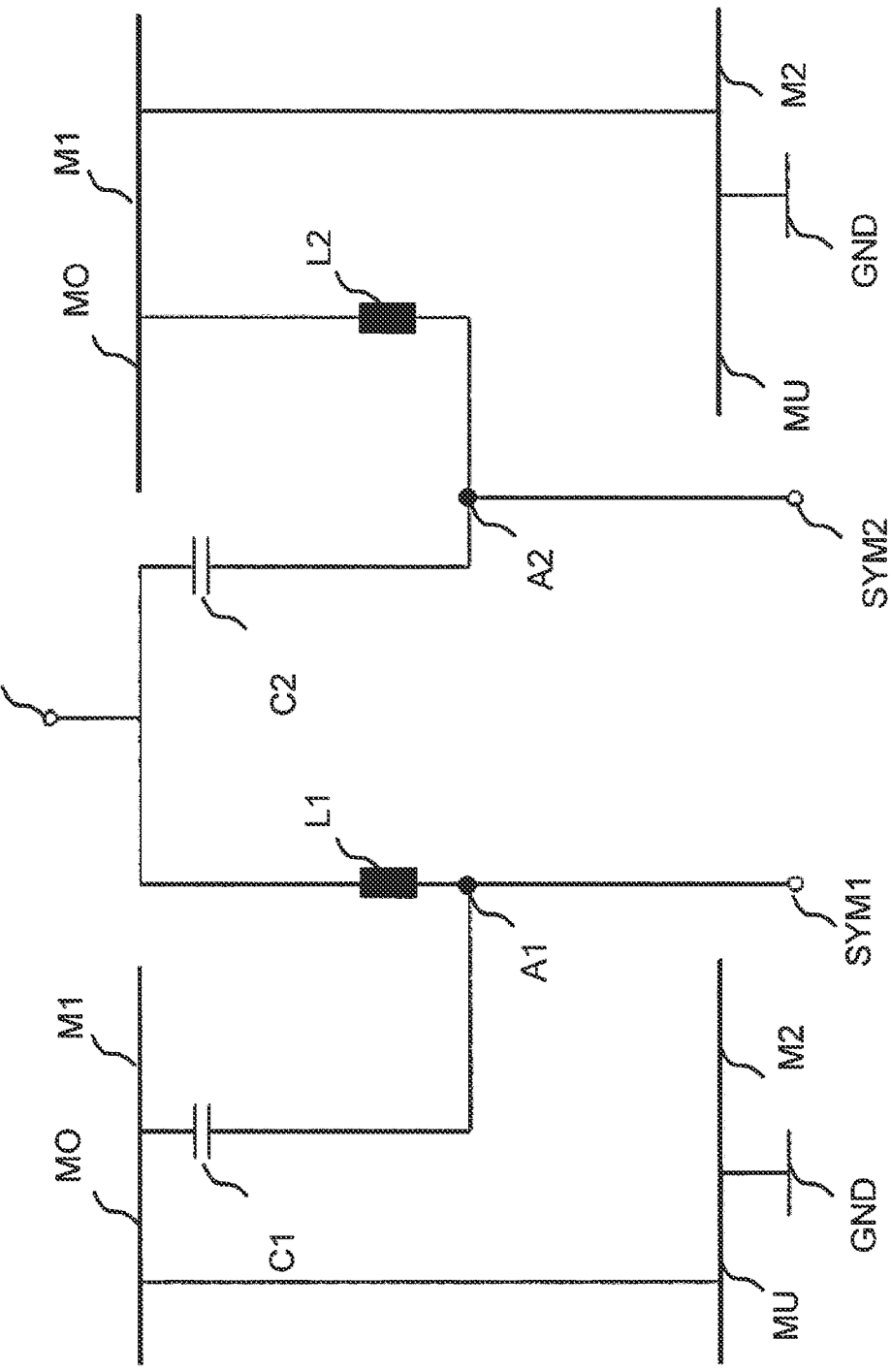
FIG. 4 shows an equivalent circuit diagram of the balun BL taking account of the circuitry realization with a multilayered ceramic substrate.

FIG. 4 shows an equivalent circuit diagram for the balun BL taking account of a geometrical cross section of the multilayer substrate. The multilayer substrate can have a first reference potential area M1 on a first surface side and a second reference potential area M2 on a second surface side, said reference potential areas both being electrically coupled to the reference potential GND, preferably to the ground potential. By way of example, the first capacitance C1 and the second capacitance C2 of the balun BL or the fourth capacitance C4 and the fifth capacitance C5 can be realized in a first patterned metallization plane, which is arranged between the upper metallization plane MO and a further patterned metallization plane, and, in a manner corresponding thereto, the first inductance L1 and the second inductance L2 or the third inductance L3 and the fourth inductance L4 can be realized in the further patterned metallization plane, which is arranged for example between the first metallization plane and the lower metallization plane MU.

LIST OF REFERENCE SIGNS

A1 First branch junction
A2 Second branch junction
A3 Third branch junction
ANT Antenna connection
BAW1 First acoustic wave filter
BAW2 Second acoustic wave filter
BL Balun
C1 First capacitance
C2 Second capacitance
C3 Third capacitance
C4 Fourth capacitance
C5 Fifth capacitance
DPL Duplexer
GND Reference potential
L1 First inductance
L2 Second inductance
L3 Third inductance
L4 Fourth inductance
LA1, LA1' First matching inductance
LA2, LA2' Second matching inductance
LANT Inductance
LAW Further matching inductance
M1 First reference potential area
M2 Second reference potential area
MO Upper metallization plane
MU Lower metallization plane P1 First parallel branch
P2 Second parallel branch
RX Reception path
RXF Reception filter
SE Unbalanced connection
SYM1 First balanced connection
SYM2 Second balanced connection
TX Transmission path

The invention claimed is:

1. A duplexer, comprising a substrate, which has at least one patterned metallization plane, and, arranged at least partly on the substrate, a transmission path and a reception path, which are both connected to an antenna connection, comprising:
 a transmission filter, which is arranged in the transmission path and which has a first acoustic wave filter having one or more resonators;
 a reception filter, which is arranged in the reception path and next to the antenna, and which has a second acoustic wave filter having one or more resonators and has a single-ended output; and
 in the reception path a balun connected downstream of the reception filter, the balun supplying a balanced signal on the output side and being embodied as an LC circuit, wherein at least one inductance or at least one capacitance of the balun is realized in the patterned metallization plane of the substrate,
 wherein the substrate is constructed from a multilayer ceramic,
 wherein the first acoustic wave filter or the second acoustic wave filter has at least one resonator that operates with bulk acoustic waves,
 wherein the balun has:
  a first balanced connection,
  a second balanced connection,
  an unbalanced connection,
  a first inductance and a second capacitance, wherein the first inductance is electrically coupled to the first balanced connection and a reference potential and the second capacitance is electrically coupled to the second balanced connection and the reference potential,
  a second inductance and a first capacitance, wherein the second inductance is electrically coupled to the second balanced connection and the unbalanced connection and the first capacitance is electrically coupled to the first balanced connection and the unbalanced connection,
  a T-element comprising a series branch and a parallel branch, and having a third capacitance and a fourth capacitance in the series branch and a third inductance in the parallel branch, wherein the third capacitance is electrically coupled in the first balanced connection and the fourth capacitance is electrically coupled to the unbalanced connection,
  a fifth capacitance, which is electrically coupled to the second balanced connection and the reference potential, and
  a fourth inductance, which is electrically coupled to the second balanced connection and the unbalanced connection,
 wherein the transmission filter has a first matching network,
 wherein the reception filter has a second matching network,
 wherein the balun, the first matching network, the second matching network, and an antenna matching network are integrated into the substrate constructed from the multilayer ceramic, and
 wherein the substrate has at least one soldering pad and the soldering pad is at least partly utilized as the third capacitance.

2. The duplexer according to claim 1, wherein the substrate has
 an upper metallization plane, in which an at least large-area first reference potential area is arranged, and a lower metallization plane, in which at least a large-area second reference potential area is arranged, wherein the first reference potential area and second reference potential area are in each case electrically coupled to a reference potential; and
 the at least one patterned metallization plane, in which capacitances or inductances of the balun or of further circuit components are realized, is arranged between the upper metallization plane and lower metallization plane.

3. The duplexer according to claim 2, wherein the substrate has an integrated first branch junction, which represents the first balanced connection of the balun, and an integrated second branch junction, which represents the second balanced connection, wherein the first branch junction and second branch junction are arranged between the upper metallization plane and lower metallization plane.

4. The duplexer according to claim 3, wherein the substrate has a total substrate thickness and the first branch junction and the second branch junction are arranged at the same level or are arranged in such a way that a level difference in a vertical direction perpendicular to the lower metallization plane or upper metallization plane between the first branch junction and the second branch junction is less than 0.2 times the total substrate thickness.

5. The duplexer according to claim 2, wherein a first parallel branch comprises the first capacitance and the first inductance and a second parallel branch comprises the second capacitance and the second inductance or the first parallel branch comprises the fourth capacitance and the third inductance and the second parallel branch comprises the fifth capacitance and the fourth inductance,
 wherein the first parallel branch is electrically coupled to the first reference potential area but not to the second reference potential area, and
 wherein the second parallel branch is electrically coupled at least to the first reference potential area.

6. The duplexer according to claim 2, wherein a metal area which is electrically coupled to the reference potential is arranged between the first capacitance and a third branch junction, which represents the unbalanced connection or a metal area which is electrically coupled to the reference potential is arranged between the fourth capacitance and the third branch junction.

7. The duplexer according to claim 1, wherein the first acoustic wave filter and the second acoustic wave filter are arranged on separate chips.

8. The duplexer according to claim 1, wherein the substrate is part of a housing for the duplexer or of a module comprising the duplexer.

* * * * *